United States Patent [19]
Green et al.

[11] Patent Number: 5,814,562
[45] Date of Patent: Sep. 29, 1998

[54] PROCESS FOR SEMICONDUCTOR DEVICE FABRICATION

[75] Inventors: Martin Laurence Green, Summit, N.J.; Yi Ma, Orlando, Fla.

[73] Assignee: Lucent Technologies Inc., Murray Hill, N.J.

[21] Appl. No.: 558,997

[22] Filed: Nov. 16, 1995

Related U.S. Application Data

[60] Provisional application No. 60/002,275 Aug. 14, 1995.

[51] Int. Cl.$^6$ ............................................ H01L 21/302
[52] U.S. Cl. ........................ 438/708; 134/1.2; 134/1.3; 438/906; 438/974
[58] Field of Search ........................... 156/643.1, 646.1, 156/662.1; 437/238, 228; 438/707, 708, 709, 906, 974; 134/1.2, 1.3

[56] References Cited

U.S. PATENT DOCUMENTS

| | | | |
|---|---|---|---|
| 4,749,440 | 6/1988 | Blackwood et al. | 156/646 |
| 4,871,416 | 10/1989 | Fukuda | 156/635 |
| 5,022,961 | 6/1991 | Izumi et al. | 156/646 |
| 5,098,866 | 3/1992 | Clark et al. | 437/239 |
| 5,234,540 | 8/1993 | Grant et al. | 156/646 |
| 5,294,568 | 3/1994 | McNeilly et al. | 867/299 |
| 5,326,406 | 7/1994 | Kaneko et al. | 134/1 |
| 5,352,327 | 10/1994 | Witowski | 156/646 |

FOREIGN PATENT DOCUMENTS

| | | |
|---|---|---|
| 0 246 802 | 5/1987 | European Pat. Off. ...... H01L 21/306 |
| 246802A2 | 11/1987 | European Pat. Off. . |
| 0688045A1 | 12/1995 | European Pat. Off. . |
| 688045A1 | 12/1995 | European Pat. Off. . |
| 5-217968 | 8/1993 | Japan . |

OTHER PUBLICATIONS

Y. Ma et al. "Vapor phase SiO2 etching and metallic contamination removal in an integrated cluster system" J. Vac. Sci. Technol. B vol. 13, No. 4 pp. 1460–1465, Jul. 1995.

N. Miki et al. "Selective etching of native oxide by dry processing using ultra clean anhydrous hydrogen fluoride" IEDM pp. 730–733, Aug. 1988.

Izumi et al "A new cleaning method by using anhydrous HF/CH30H vapor sytsem" Symposium on cleaning technology in semiconductor device manufacturing, eds J. Ruzyllo et al. EOS Proceedings vol. 92–12 pp. 260–266, 1992.

"Study on Chlorine Adsorbed Silicon Surface Using Soft–X–Ray Photoemission Spectroscopy", Matsuo, J., Karahasi, K., Sato, H., *Journal of Applied Physics,* vol. 31 (1992), pp. 2025–2029.

"Vapor Phase Hydrocarbon Removal for Si Processing," *Applied Physics Letters,* 57(20), 12 Nov. 1990, pp. 2095–2097.

"Low Temperature Silicon Surface Cleaning by HF Etching/Ultraviolet Ozone Cleaning (HF/UVOC) Method (II)–In situ UVOC," Kaneko, T., Suemitsu, M., Miyamotto, N., Research Institute of Electrical Communication, Tohoku University, Sendai 980, (Oct. 21, 1989).

"Low Temperature Silicon Surface Cleaning by HF Etching/Ultraviolet Ozone Cleaning (HF/UVOC) Method (I)–Optimization of the HF Treatment", Suemitsu, M., Kaneko, T., Miyamot, N., Research Institute of Electrical Communication, Tohoku University, Sendai 980 (Oct. 21, 1989).

"Surface Composition Analysis of HF–Vapour–Cleaned Silicon by X–ray Photoelectron Spectroscopy," Ermolieff, A., Martin, F., Amouroux, A., Marthon, S. Westendiorp, J. F. M., *Semicond. Sci. Technol.* 6 pp. 98–102, (1991).

"Mechanism of Cleaning and Etching Si Surfaces With Low Energy Chlorine Ion Bombardment," Bello, I., Chang, W. H., Lau, W. M., *Journal of Applied Physics,* 75 (6), pp. 3092–3097, (Mar. 15, 1994).

"Etching of Thermal Oxides in Low Pressure Anhydrous HF/CH$_3$ OH Gas Mixture at Elevated Temperature," Ruzyllo, J., Torek, K., Daffron, C., *J. Electrochem. Soc. Soc.,* vol. 140, No. 4, pp. 64–66, (Apr. 1993).

"Characterization of Wafer Cleaning and Oxide Etching Using Vapor–Phase Hydrogen Fluoride", Wong, M., Moslehi, M. M., Reed, D. W., *J. Electrochem. Sco.,* vol. 138, No. 6, pp. 1799–1802, (Jun. 1991).

"Silicon Surface Cleaning Using Photoexcited Fluorine Gas Diluted with Hydrogen", Aoyama, T., Yamazaki, T., Ito, T., *J. Electrochem. Soc.,* vol. 140, No. 6, pp. 1704–1708, (Jun. 1993).

(List continued on next page.)

*Primary Examiner*—R. Bruce Breneman
*Assistant Examiner*—Anita Alanko
*Attorney, Agent, or Firm*—Richard J. Botos

[57] ABSTRACT

The present invention is directed to a process for fabricating a semiconductor integrated circuit device, and specifically, a process for cleaning a silicon substrate before gate silicon dioxide is formed on the silicon substrate. The gate silicon dioxide is used to form transistor gates. The process of the present invention provides a silicon/silicon dioxide interface and the bulk silicon dioxide with advantageous electrical properties. In the present process, the silicon substrate is first subjected to a stream of hydrofluoric acid (HF) vapor. The vapor HF stream is a mixture of anhydrous HF, methanol, and nitrogen. Following this, the substrate is subjected to gaseous chlorine that has been irradiated with broad band UV radiation. After the substrate has been cleaned according to the present process, a layer of silicon dioxide is grown thereon using conventional techniques such as rapid thermal oxidation (RTO). It is advantageous if the cleaned silicon surface is kept under high vacuum or in an inert gas environment before the oxide growth is commenced. In the context of the present process, it is advantageous if the substrate is maintained in an essentially oxygen-free atmosphere from the time the HF vapor step is started until the growth of silicon dioxide is commenced. After the oxide is grown thereon, device structures are formed on the silicon substrates using conventional processing techniques.

10 Claims, 2 Drawing Sheets

OTHER PUBLICATIONS

"Surface Cleaning for Si Epitaxy Using Photoexcited Fluorine Gas," Aoyama, T., Yamazaki, T., Ito, T., *J. Electrochem. Soc.,* vol. 140, No. 2, pp. 366–370, (Feb. 1993).

"An Analysis of LPCVD System Parameters for Polysilicon, Silicon Nitride and Silicon Dioxide Deposition," Brown, W. A., Kamins, T. I., *Solid State Technology,* pp. 51–84, (Jul. 1979).

"Low Pressure CVD Production Processes for Poly, Nitride, and Oxide", Rosler, R. S., *Solid State Technology,* pp. 63–70, (Apr. 1977).

"Wafer Temperature Dependence of the Vapor–Phase HF Oxide Etch," Wong, M., Moslehi, M. M., Bowling, R. A., Texas Instruments, Semiconductor Process and Design Center, Dallas Texas 75265, pp. 205–208.

PROCESS FOR SEMICONDUCTOR DEVICE FABRICATION

CROSS-REFERENCE TO RELATED APPLICATION

This application claims priorty of Provisional application Ser. No. 60/002,275 which was filed on Aug. 14, 1995.

BACKGROUND OF THE INVENTION

1. Technical Field

The present invention is directed to a process for semiconductor device fabrication, and, more specifically, a process for vapor phase cleaning of a silicon substrate before the gate oxide is formed thereon.

2. Art Background

In semiconductor device processing, one aspect of device fabrication is the cleaning of the silicon wafer substrates before subsequent processing. For example, before silicon dioxide is grown on the surface of the silicon wafer to form the gate oxide, the wafer is cleaned to remove particulate contaminants and any native oxide that may have formed on the portions of the wafer over which the gate oxide is to be grown. The cleaning step is especially critical prior to the growth of gate oxide on the silicon wafers. As one skilled in the art is aware, gate oxide is the thin layer of oxide below the gate in a transistor such as a MOSFET. Since the effectiveness of the cleaning step prior to gate oxide growth affects the electrical properties of the grown oxide, it follows that the effectiveness of the cleaning step affects the performance of the devices in which that oxide is incorporated.

Numerous procedures are used to clean the silicon wafers. One procedure is the standard RCA cleaning process. However, as noted in Srinandan, R., et al., "Vapor phase hydrocarbon removal for Si processing," *Appl. Phys. Lett.,* 57: 20, pp. 2095–2097 (1990), the RCA process forms an oxide on the wafer surface which must then be removed by rinsing the wafer with hydrofluoric acid (HF). Because HF is an extremely strong acid, alternatives to the RCA process have been proposed. The alternative proposed in Srinandan et al. is a vapor phase process that uses oxygen that is photoexcited using an ultraviolet (UV) lamp to remove organic contaminants from the silicon wafer. The UV irradiation of oxygen produces ozone, and the process is often referred to as ozone cleaning. Srinandan et al. note that such a process is easily integrated into a wafer cleaning cluster tool that provides a multichamber processing environment, which is currently being used in processes for device fabrication because it allows in situ integration of a sequence of processes. However, UV-irradiated oxygen alone is not sufficient to adequately clean silicon wafers before the gate oxide is grown thereon. As noted in Kaneko, T., et al., "Low Temperature Silicon Surface Cleaning by HF Etching/ Ultraviolet Ozone Cleaning (HF/UVOC) Method (II)-in situ UVOC," *Research Institute of Electrical Communication,* Sendai 980, pp. 2425–2429 (Tohuko University 1989), HF-solution treatment is used in conjunction with UV irradiation of oxygen ($UVO_2$ hereinafter) to clean substrates. The HF-solution is used to remove surface contaminants such as oxides that form on the surface, and the $UVO_2$ step is used to remove residual organic contaminants.

Use of an HF solution to clean substrates is not compatible with multichamber processing because the substrates must be immersed in the liquid HF. Ermolieff, A., et al., "Surface composition analysis of HF-vapour-cleaned silicon by x-ray photoelectron spectroscopy," *Semicond. Sci. Technol.,* Vol. 6, pp. 98–102 (1991) observe that HF vapor cleaning is compatible with multichamber processing. Bello, I., et al., "Mechanism of cleaning and etching Si surfaces with low energy chlorine ion bombardment," *J. Appl. Phys.,* 75: 6, pp. 3092–3097 (1994) investigated the effects of chlorine ion bombardment on silicon wafers that were cleaned using a 5% HF solution. Bello et al. observed that residual surface oxygen on HF treated silicon was removed by chlorine ion bombardment. Bello et al. propose using low energy chlorine ion bombardment coupled with a subsequent atomic hydrogen exposure as a dry process for the generation of clean hydrogen-terminated silicon. However, Bello et al. also observe that, even at low energy, chlorine bombardment damages the surface of the silicon wafer by introducing undesirable dislocations. Accordingly, although numerous processes for cleaning silicon wafers have been proposed, a wafer cleaning process that is compatible with a wafer cleaning cluster tool for multichamber processing is desired.

SUMMARY OF THE INVENTION

The present invention is directed to a two step process for cleaning silicon wafers in processes for semiconductor device fabrication. In the process of the present invention, silicon wafer substrates are subjected to vapor-phase HF followed by exposure to chlorine gas that has been irradiated with UV radiation. It is advantageous if the silicon wafer is maintained in an essentially oxygen-free environment from the time the first cleaning step is commenced until the cleaned wafer is subjected to conditions for growing the gate oxide thereon. After the gate oxide is grown on the wafer, devices such as MOSFETs are formed on the silicon wafer. The devices unexpectedly have better electrical properties, such as better reliability, than devices formed on wafers that are cleaned using other processes for cleaning silicon substrates in preparation for growing gate oxide thereon. In a preferred embodiment, the process is practiced in a multichamber processing tool (frequently referred to as a cluster tool).

Silicon wafers are first placed in an atmosphere that is essentially free of oxygen. In a preferred embodiment the wafers are placed in a vaccum. However, inert gases (i.e., gases that are essentially non-reactive with silicon) such as argon or nitrogen, are suitable as atmospheres in which to practice the process of the present invention. The wafers are then subjected to an etching mixture of HF an methanol. An exemplary HF/methanol vapor mixture is disclosed in Ruzyllo, J., et al., "Etching of Thermal Oxides in Low Pressure Anhydrous $HF/CH_3OH$ Gas Mixture at Elevated Temperature," *J. Electrochem. Soc.,* 140: 4, pp. L64–L66 (1993), which is hereby incorporated by reference. Ruzyllo, J. et al. describe a vapor-phase HF etchant that is a gaseous mixture of anhydrous HF, methanol and nitrogen. Typically, nitrogen is bubbled through liquid methanol to provide methanol vapor. A separate nitrogen stream is used to dilute the vapor HF and maintain the chamber pressure.

In the present process the flow rate of the anhydrous HF is about 5 sccm to about 1000 sccm, the flow rate of nitrogen bubbled through methanol ($N_2$-methanol) is about 5 sccm to about 1000 sccm, and the flow rate of nitrogen is about 0 sccm to about 20,000 sccm. It is advantageous if the flow rate of anhydrous HF is about 100 sccm, the flow rate of $N_2$-methanol is about 100 sccm and the flow rate of nitrogen is about 500 sccm. The pressure during the HF vapor clean is about 1 Torr to about 760 Torr. It is advantageous if the pressure during the HF vapor step is about 200 Torr. The temperature of the wafer during the vapor-phase HF step is about ambient temperature to about 300° C. It is advantageous if the temperature of the wafer is about 50° C. The relative amounts of the anhydrous HF, methanol, and nitrogen in the vapor-phase HF etchant are selected so that the etch rate of the silicon dioxide is about 1 Å/min to about 50 Å/min. It is advantageous if the etch rate is about 5 Å/min to about 20 Å/min.

After vapor phase HF etching, the silicon wafer is then subjected to a stream of photoexcited chlorine ($Cl_2$). This process is referred to hereinafter as $UVCl_2$. Typically, the $UVCl_2$ step will take about 5 seconds to one hour, depending upon the conditions (e.g. temperature pressure, flow rate). It is advantageous if conditions are selected such that the $UVCl_2$ step takes about 30 seconds. The flow rate of the $Cl_2$ is about 1 sccm to about 1000 sccm. It is advantageous if the flow rate is about 100 sccm. The pressure during the $UVCl_2$ step is about 1 mTorr to about atmospheric. It is advantageous if the pressure during this step is about 10 Torr. The temperature of the wafer during the $UVCl_2$ step is about room temperature to about 300° C., preferably about 100° C. It is advantageous if the $Cl_2$ gas stream is irradiated using a broadband UV light source with a wavelength range of about 200 nm to about 1100 nm.

After the wafer has been cleaned according to the present process, a layer of silicon dioxide is grown thereon using conventional techniques such as rapid thermal oxidation (RTO). After the oxide is grown thereon, device structures are formed on the silicon wafers using conventional processing techniques.

Silicon wafers that are cleaned according the above process have superior electrical characteristics compared to silicon wafers that are cleaned using other conventional techniques. The interface state density of wafers cleaned using the process of the present invention is less than the interface trap density of wafers cleaned using conventional processes such as a wet HF etch, a single anhydrous HF etch, or an anhydrous HF etch followed by a $UVO_2$ etch. The leakage current density of wafers cleaned using the process of the present invention is also less than the leakage current density of wafers cleaned using the other above-mentioned processes. The charge-injection tolerance of wafers cleaned using the process of the present invention is higher than the charge-injection tolerance of wafers cleaned using the other above-mentioned processes. In a preferred embodiment, the amount of charge required for the breakdown of 50 percent of the devices formed on a wafer is greater than 10 coulombs/$cm^2$. This compares to a comparable charge-to-breakdown of less than 8 coulombs/$cm^2$ for fifty percent of the devices formed on wafers cleaned using other processes.

DETAILED DESCRIPTION

Figure 1:
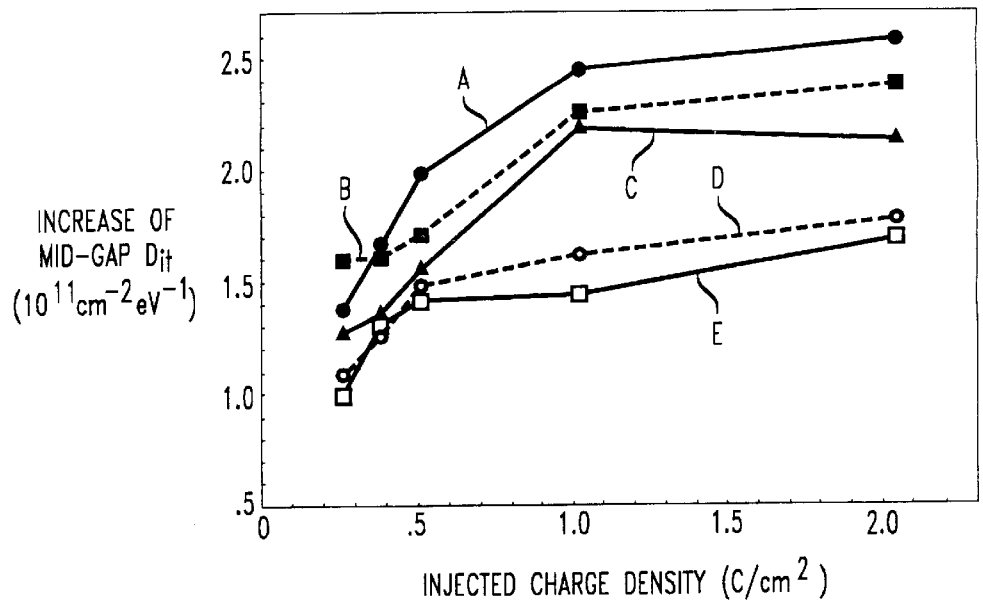
FIG. 1 is a graph of the interface state density as a function of the injected charge of devices wherein the silicon substrates were cleaned using a variety of processes before the gate oxide was formed thereon.

The present invention is directed to a process with at least two steps for cleaning silicon wafers in processes for semiconductor device fabrication. The process of the present invention is particularly useful when used in a multichamber (also referred to as a cluster tool) apparatus for use in semiconductor device fabrication. The process is vacuum-compatible, but the wafer-cleaning process is also capable of being practiced in an inert atmosphere.

The wafers are placed in an essentially oxygen-free environment. Although a vacuum is preferred because a vacuum is compatible with conventional cluster tools for device processing, the wafers can also be placed in an atmosphere that is inert with respect to silicon. Argon and nitrogen are examples of such atmospheres. The silicon wafers are then subjected to a vapor-phase HF etch. The vapor-phase HF etchant is a gaseous mixture of anhydrous HF, methanol and nitrogen. In applicants' invention, the flow rate of the anhydrous HF is about 5 sccm to about 1000 sccm, the flow rate of $N_2$-methanol is about 5 sccm to about 1000 sccm, and the flow rate of nitrogen is about 0 sccm to about 20,000 sccm. It is advantageous if the flow rate of anhydrous HF is about 100 sccm, the flow rate of $N_2$-methanol is about 100 sccm and the flow rate of nitrogen is about 500 sccm. The pressure during the vapor-phase HF etch is about 1 Torr to about atmospheric. It is advantageous if the pressure during the vapor-phase HF etch is about 200 Torr. The temperature of the wafer during the vapor-phase HF etch is about ambient temperature to about 100° C. It is advantageous if the temperature of the wafer is about 50° C. during this step.

The relative amounts of the anhydrous HF, methanol, and nitrogen in the vapor-phase HF etchant are selected so that the etch rate of the silicon dioxide is about 1 Å/min to about 50 Å/min. It is advantageous if the etch rate is about 5 Å/min to about 20 Å/min. By way of example, for an etch rate of 20 Å/min at a temperature of 50° C. and a pressure of 200 Torr, the flow rates are: $N_2$=550 sccm; AHF=150 sccm; and $N_2$-methanol=200 sccm. For an etch rate of 5 Å/min at a temperature of 60° C. and a pressure of 200 Torr, the flow rates are $N_2$=1000 sccm; AHF=100 sccm, and $N_2$-methanol= 75 sccm.

While maintaining the silicon wafers in an essentially oxygen-free environment, the wafers are then subjected to a stream of photoexcited chlorine ($Cl_2$). The flow rate of the $Cl_2$ is about 1 sccm to about 1000 sccm. It is advantageous if the flow rate is about 100 sccm. The pressure during this step is about 1 mTorr to about atmospheric. It is advantageous if the pressure is about 10 Torr. The temperature of the wafer during the $UVCl_2$ step is about ambient to about 300° C., preferably about 100° C. It is advantageous if the $Cl_2$ gas stream is irradiated using a UV light source with a wavelength range of about 200 nm to about 1100 nm.

It is contemplated that additional wafer-cleaning steps can be used in conjunction with applicants' two step cleaning process. For example, after a wafer has been cleaned using the two-step process described above, the wafer can be cleaned using a stream of oxygen irradiated by broad band (200 nm to 1100 nm) radiation. As previously observed, $UVO_2$ is used to remove hydrocarbon from silicon wafers. However, because the $UVO_2$ contains some oxygen, there is some incorporation of oxygen into the silicon wafer during such a cleaning step. Therefore, the electrical properties of devices formed on wafers cleaned by the process of the present invention with the $UVO_2$ step are not quite as good as the electrical properties of devices formed on wafers cleaned with the two-step process described above. Furthermore, as noted above, if the $UVO_2$ step is used at all, it is to be used after the two step (vapor AHF followed by $UVCl_2$) process.

After the wafers are cleaned using the process of the present invention, the wafers are subjected to conditions for the growing of oxide on the surface of the wafer. Standard processes such as rapid thermal oxidation (RTO) are contemplated as suitable. Once the oxide growth step is commenced, it is no longer required that the wafer be maintained in an essentially oxygen-free environment.

After the oxide is grown on the wafer, devices are formed thereon. One skilled in the art will recognize that there are many different types of devices that have a gate oxide. The following is one exemplary process for device fabrication. One skilled in the art will appreciate that numerous processes can be used to form devices on grown gate oxide. The following process is merely an example, and the description of this process is not meant to indicate that this process for device fabrication is more compatible with wafers cleaned according to the process of the present invention than other processes for device fabrication.

After the gate oxide is grown, a 2000 Å-thick layer of polysilicon is formed over the gate oxide layer. The polysilicon is subjected to a phosphorous ion implant at 40 KeV at a dose of $5\times10^{15}/cm^2$. The dopant is activated at a temperature of 1030° C. for 10 seconds in an Argon atmosphere. The wafer is also subjected to a drive-in process at 850° C. for 60 minutes in a nitrogen atmosphere that is two percent by volume oxygen. Front, i.e., device-side, contacts of aluminum are formed on the device. Aluminum contacts are then formed on the back of the wafer. The aluminum contacts are then annealed at 330° C. for 30 minutes.

Devices formed on wafers cleaned using the process of the present invention have advantageous electrical properties. Specifically, a better quality oxide is grown on wafers cleaned using the process of the present invention. Better quality oxides can withstand higher charge injection than oxides of lesser quality. For example, over fifty percent of the devices formed on wafers cleaned using the process of the present invention can withstand a charge injection of at least about 10 Coulombs/cm$^2$. Less than fifty percent of the devices formed on wafers cleaned using other processes can withstand a charge injection of about 10 Coulombs/cm$^2$. Consequently, since devices with a higher charge to breakdown have a longer lifetime, devices formed on wafers cleaned using the present process outperform devices formed on wafers cleaned using other processes.

EXAMPLE 1

Silicon wafers (n-type Si(100)) with a resistivity of 3 to 5 ohm-cm were chemically cleaned in a solution of sulfuric acid and hydrogen peroxide (12.5:1) at a temperature of 105° C. for 10 minutes. A 200 Å-thick oxide (sacrificial) layer was grown on the wafers in an oxygen atmosphere at 1000° C. For the control samples, the oxide formed was removed by dipping the control wafers in an aqueous solution of hydrofluoric acid (100:1) for 90 seconds, which rendered the wafers hydrophobic. Oxide with a nominal thickness of 55 Å was then grown on the control wafers by rapid thermal oxidation (RTO). The wafers cleaned in this manner are referred to in this example as the control wafers.

All of the remaining wafers with the sacrificial oxide thereon were loaded into a cluster tool (AG Associates Integra One tool) after they were rinsed with deionized water and spun dry in a nitrogen atmosphere. A wafer was placed in a load lock and a robot placed the wafer into a wafer cleaning module (Submicron Sytem's Primaxx tool). A reactive gas mixture of anhydrous hydrofluoric acid (AHF) and N$_2$-methanol in a nitrogen carrier gas was introduced into the cleaning module to remove the sacrificial oxide from the wafers. The flow rates of anhydrous AHF, methanol and nitrogen were 150 sccm, 200 sccm, and 550 sccm, respectively. The temperature was 50° C. and the chamber pressure in the module was 200 Torr. The oxide etch rate under these conditions was about 20 Å/min. Several of the wafers were only subjected to this cleaning step. These wafers are referred to as the "AHF-only" wafers. The remaining wafers were subsequently cleaned using additional process steps described below.

Several of the remaining wafers were subjected to irradiated chlorine gas for one minute. The chlorine gas had been exposed to broad band (200 nm to 1100 nm) UV light that was generated by a Xenon UV lamp. The wafer temperature was 200° C., the pressure was 10 Torr, and the chlorine flow rate was 100 sccm. The wafers that were cleaned using the AHF step followed by this step are referred to as the "AHF/UVCl$_2$" wafers.

Several other remaining wafers were subjected to irradiated oxygen. Some of these wafers had been subjected to the AHF step alone and are referred to as the "AHF/UVO$_2$" wafers. Some of the wafers had been subjected to both the AHF step and the UVCl$_2$ step and are referred to as the "AHF/UVCl$_2$/UVO$_2$" wafers. The oxygen was exposed to broad band (200 nm to 1100 nm) UV light that was generated by a Xenon UV lamp. The temperature of the wafer was 50° C., the pressure was 200 Torr, and the flow rate was 1000 sccm.

In summary, a total of about 75 wafers were cleaned using the following processes:

TABLE 1

| PROCESS | DESIGNATION |
|---|---|
| CONTROL | A |
| AHF only | B |
| AHF/UVCl$_2$ | C |
| AHF/UVO$_2$ | D |
| AHF/UVCl$_2$/UVO$_2$ | E |

The wafers B–E were also subjected to RTO (after being cleaned as described above) at 1000° C. in a pure O$_2$ atmosphere for about thirty seconds to grow a layer of silicon oxide with a nominal thickness of 55 Å on the wafer surface.

Metal-Oxide-Semiconductor (MOS) structures of various sizes (0.0001–0016 cm$^2$) were then manufactured on the wafers cleaned as described above. A 2000 Å thick layer of polysilicon was formed on the wafers using conventional processing techniques well-known to one skilled in the art. The wafers were then subjected to a phosphorous ion implant at 40 KeV and a dosage of $5\times10^{15}/cm^2$. The dopant was then activated at 1030° C. for 10 seconds in an Argon atmosphere followed by a drive-in process at 850° C. for 60 minutes in a nitrogen atmosphere containing two-percent oxygen. Aluminum metal contacts were then formed on the front side (i.e., the device side) and the back side of the wafer. MOS structures were then defined using conventional lithographic techniques. All of the devices formed had apporoximately the same capacitor area. The wafers were then subjected to an anneal at 330° C. for 30 minutes.

The interface state density ($D_{it}$) between the silicon and the silicon dioxide was then measured for the devices prepared as described above. The state density was measured using a capacitance-voltage (C-V) techniques. In this technique, the capacitance of the device is recorded as the gate voltage supplied to the device is swept from 2 volts to −2 volts in 0.05 volt increments. More interface state density is generated when the devices are under electrical stress. Therefore, a lower interface state density is an indication of a more reliable device. The range of voltages used was in both the accumulation and inversion regions of the device. The capacitors had an area of 4×10⁻⁴ cm². The capacitance response to the voltages sweep is different at different frequencies, but the interface state only respond to quasi-static frequency. Therefore the interface state densities of the wafers were calculated from the difference between the high frequency and quasi-static response of the devices as the gate voltage was varied as described above. The C-V data was collected from wafers that were cleaned using processes A–E as described above. Ten individual capacitors on each selected wafer were tested using this technique. As illustrated by FIG. 1, the interface state density increases as a function of charge density for all devices formed on wafers using processes A–E. Devices formed on wafers using processes C and E (the processes that utilize vapor HF followed by UVCl$_2$) had a somewhat lower D$_{it}$ than the devices formed on wafers cleaned by the conventional liquid HF.

Figure 2:
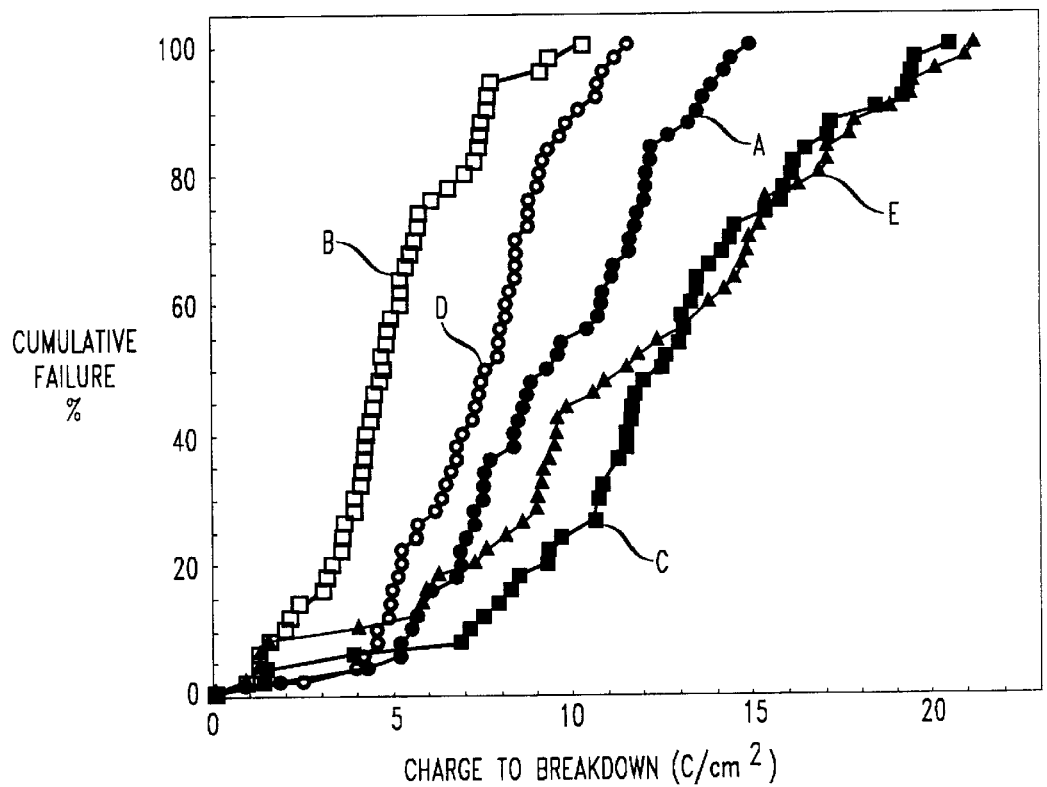
FIG. 2 is a graph of the cumulative failure of devices as a function of charge wherein the silicon substrates were cleaned using a variety of processes before the gate oxide was formed thereon.

The electrical integrity of the silicon dioxide layer was characterized by a time dependent dielectric breakdown (TDDB) procedure. In this procedure, a constant voltage was applied to the devices on the wafer. Charge was injected into the oxide from the wafer substrates using a positive gate bias. Charge is injected into the oxide under these conditions when the substrate is p-type. The current density under these conditions was 250 mA/cm². The capacitor dots on the devices had an area of 4×10⁻⁴ cm². The period of time from the beginning of the charge injection to the breakdown of the dielectric was recorded. A total of 50 capacitors were measured on each wafer. The total amount of charge applied to the devices on the wafer was observed as a function of the percent of devices at breakdown. This value is reported as Q$_{BD}$ (total charge applied) in coulombs/cm². The electrical integrity of devices made from wafers cleaned using a variety of processes is reported in FIG. 2. FIG. 2 illustrates that the devices cleaned using the two-step vapor-phase HF/UVCl$_2$ process of the present invention have a significantly lower breakdown rate at a given Q$_{BD}$ value than devices formed on wafers cleaned using a variety of other processes. In fact, devices formed on wafers cleaned using the two-step process performed better than devices formed on wafers cleaned using the two-step process followed by UVO$_2$. However, devices formed on wafers cleaned using processes C and E outperformed devices formed on wafers cleaned by processes A, B, and D in Table 1.

The leakage current of the devices made from the control wafers and the AHF/UVCl$_2$ wafers was also measured. These measurements were made using a Keithley 595 Quasi-static CV meter. The current resolution was in the range of 20 pA was 1 fA. The leakage current was measured as a function of applied electrical field. The leakage current for devices made from wafers cleaned according to control process A was compared to the leakage current of devices made from wafers cleaned using the two-step process of the present invention. When electric fields in the range of 4 to 9 MV/cm were applied to devices formed on wafers cleaned using processes A and C, the leakage current for the "process A" devices was higher than the leakage current for the "process C" devices. For example, at an electrical field of 6.2 MV/cm, the leakage current density for the "process A" devices was more than twice that of the leakage current density for the "process C" devices.

The comparison of the electrical properties of devices formed on wafers cleaned by the various processes described above are summarized in the following Table 2.

TABLE 2

| Sample | Interface State Density 10¹⁰/cm² eV | Charge at 50% Cumulative Failure (C/cm²) | Leakage Current Density (A/cm²) |
|---|---|---|---|
| A | 6.2 | 9.3 | 2.1 × 10⁻⁸ |
| B | 5.2 | 4.8 | — |
| C | 1.8 | 12.5 | 1 × 10⁻⁸ |
| D | 4.2 | 7.6 | — |
| E | 5.7 | 11.6 | — |

EXAMPLE 2

Figure 3:
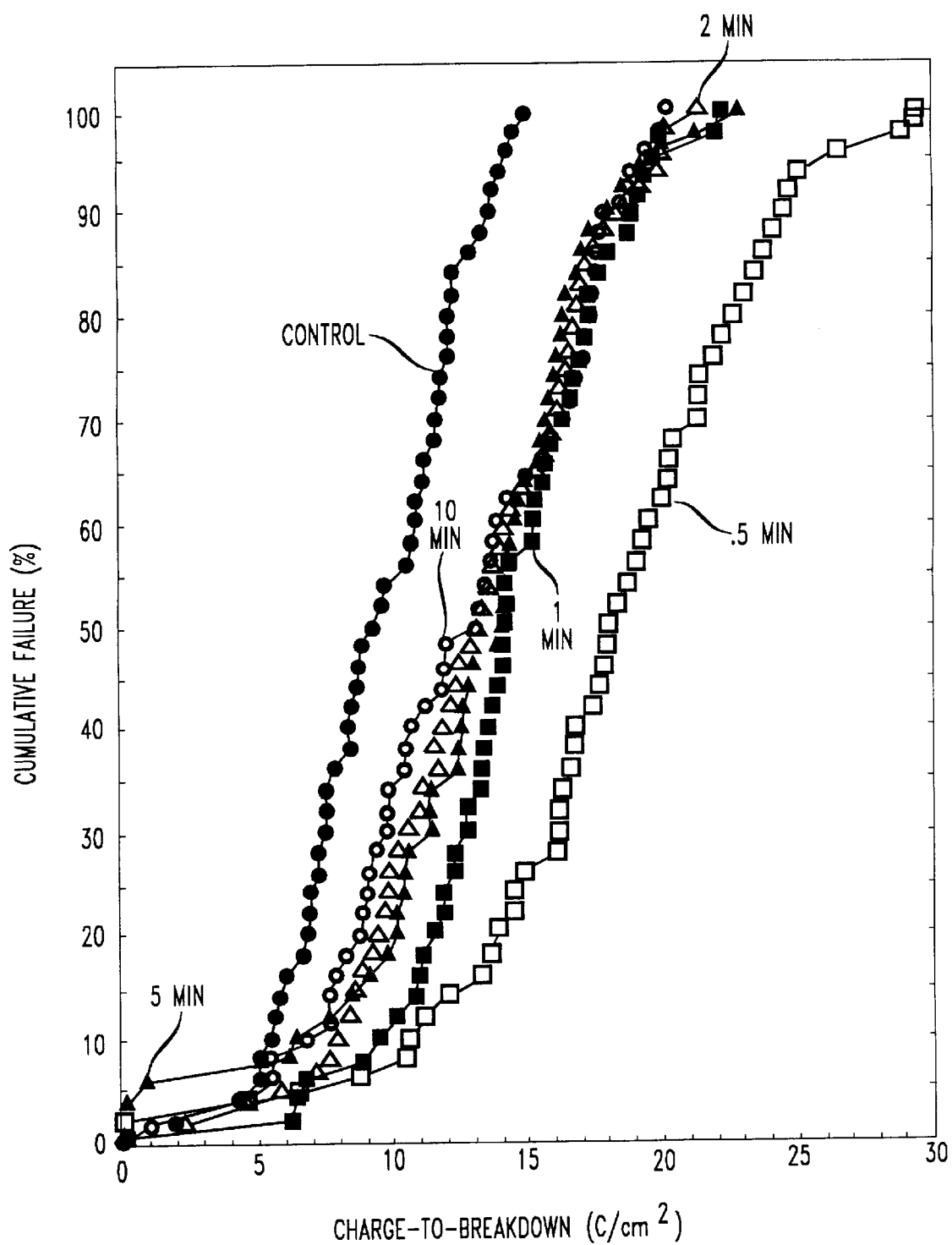
FIG. 3 is a graph of the effect of cleaning time on the cumulative failure of devices as a function of charge for wafers using the process of the present invention.

The effect of UV/Cl$_2$ cleaning time on the electrical properties of devices formed on wafers cleaned using the process of the present invention was determined by varying the amount of time of the UVCl$_2$ step of process C described in Example 1. Specifically, wafers were subjected to the UVCl$_2$ (at the temperature, pressure, and flow rate specified in Example 1) step for 0.5, 1, 2, 5, and 10 minutes. The devices were subjected to TBBD as described in the previous example. The results are illustrated in FIG. 3. As illustrated in FIG. 3, the cumulative failure of the devices as a function of charge was affected by the amount of time to which the wafer was exposed to the UVCl$_2$ step. Devices formed on wafers cleaned by a process with a UVCl$_2$ step of 30 seconds have a substantially higher charge to breakdown at 50 percent cumulative failure than devices formed on wafers which were cleaned using a process in which this step was a minute or more. However, as is observed from FIG. 3, even when the UVCl$_2$ step lasted 10 minutes, the devices formed on wafers cleaned by that process had a higher charge to breakdown than devices formed on wafers cleaned by the control process. It is believed that, since the UVCl$_2$ step causes surface roughness, a longer UVCl$_2$ step can cause increased roughness. Since roughness adversely affects oxide integrity, a device formed on a wafer cleaned by a process with a 30 second UVCl$_2$ has slightly better electrical properties than devices made on wafers cleaned by processes in which this step is longer. One would expect similar results if one were to increase the temperature or pressure of the UVCl$_2$ step conditions, i.e. a slight increase in surface roughness that slightly reduces the charge to breakdown threshold of devices formed on the wafer.

The invention claimed is:

1. A process for fabricating a device comprising:
    cleaning a silicon substrate by two step process consisting essentially of 1.) contacting a silicon substrate with a gaseous mixture comprising anhydrous hydrofluoric acid, for a period of time that is sufficient to remove substantially all of the oxide from the surface of the silicon substrate; followed by 2.) contacting the silicon substrate with a stream of gaseous chlorine that has been subjected to broad band ultraviolet radiation with a wavelength in the range of about 200 nm to about 1100 nm wherein the substrate is maintained in an essentially oxygen free environment during steps 1.) and 2.) and the time therein between;
    growing a layer of oxide over the surface of the cleaned silicon substrate; and
    forming a semiconductor device on the silicon substrate.

2. The process of claim 1 wherein the substrate is subjected to the stream of gaseous chlorine for a time sufficent to provide devices on the substrate with a charge to breakdown of at least 10 coulombs/cm² for at least fifty percent of the devices formed on the substrate.

3. The process of claim 2 wherein the flow rate of the chlorine stream is about 1 sccm to about 1000 sccm.

4. The process of claim 3 wherein the pressure of the atmosphere when the substrate is contacted with the chlorine stream is about 1 mTorr to about 760 Torr.

5. The process of claim 4 wherein the temperature of the substrate when it is contacted with the chlorine stream is about ambient temperature to about 1000° C.

6. The process of claim 5 wherein the silicon substrate is subjected to the stream of irradiated chlorine for about 30 seconds to about 10 minutes.

7. The process of claim 1 wherein the gaseous anhydrous hydrofluoric acid stream further comprises $N_2$-methanol and nitrogen.

8. The process of claim 7 wherein the composition of the gaseous anhydrous hydrofluoric acid stream is selected so that the etch rate of the oxide on the surface of the silicon substrate is about 1 Å to about 50 Å per minute.

9. The process of claim 1 wherein the substrate is exposed to a stream of oxygen that has been irradiated with broad band ultraviolet radiation with a wavelength of about 200 nm to about 1100 nm after step 2.).

10. The process of claim 6 wherein the substrate is exposed to the stream of irradiated chlorine for one minute or less and the flow rate of the chlorine stream is about 50 sccm to about 200 sccm, wherein the pressure is about 1 Torr to about 100 Torr, the substrate temperature is about 50° C. to about 200° C.

* * * * *